United States Patent
Qin et al.

(10) Patent No.: US 7,735,716 B2
(45) Date of Patent: Jun. 15, 2010

(54) METHOD OF CONTROLLING THE TRAJECTORY OF A BONDING TOOL DURING THE FORMATION OF A WIRE LOOP

(75) Inventors: Wei Qin, Lansdale, PA (US); Ziauddin Ahmad, Villanova, PA (US); Itzhak Barkana, Ramat Hasharon (IL); Igor Fokin, Warminster, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 0 days.

(21) Appl. No.: 12/374,402

(22) PCT Filed: Oct. 25, 2007

(86) PCT No.: PCT/US2007/082482

§ 371 (c)(1),
(2), (4) Date: Jan. 20, 2009

(87) PCT Pub. No.: WO2008/057776

PCT Pub. Date: May 15, 2008

(65) Prior Publication Data

US 2009/0314822 A1    Dec. 24, 2009

Related U.S. Application Data

(60) Provisional application No. 60/863,148, filed on Oct. 27, 2006.

(51) Int. Cl.
*B23K 31/02* (2006.01)
(52) U.S. Cl. .................................. 228/180.5; 228/4.5
(58) Field of Classification Search ............. 228/180.5, 228/4.5
See application file for complete search history.

(56) References Cited

U.S. PATENT DOCUMENTS

| | | | |
|---|---|---|---|
| 4,445,633 A | 5/1984 | Bonham, Jr. | |
| 5,205,463 A | 4/1993 | Holdgrafer | |
| 6,010,057 A * | 1/2000 | Egger et al. | .............. 228/102 |
| 6,131,799 A | 10/2000 | Egger et al. | |

* cited by examiner

*Primary Examiner*—Jessica L Ward
*Assistant Examiner*—Megha Mehta
(74) *Attorney, Agent, or Firm*—Christopher M. Spletzer, Sr.

(57) ABSTRACT

A method of determining a trajectory of an arc motion of a wire used in the formation of a wire loop is provided. The arc motion is between a first point and a second point of the trajectory. The method includes: (1) defining a pivot point with respect to the first point and the second point; (2) determining a plurality of data points for generating the trajectory, each of the data points including a radius value and an angle value as a function of time, each of the angle values being between (a) a first angle defined by the pivot point and the first point, and (b) a second angle defined by the pivot point and the second point; and (3) converting the plurality of data points into trajectory data that may be used by a wire bonding machine.

25 Claims, 8 Drawing Sheets

METHOD OF CONTROLLING THE TRAJECTORY OF A BONDING TOOL DURING THE FORMATION OF A WIRE LOOP

CROSS-REFERENCE TO RELATED APPLICATION

This application claims the benefit of International Application No. PCT/US2007/082482 filed Oct. 25, 2007, which claims priority to U.S. Provisional Application No. 60/863,148, filed Oct. 27, 2006, the contents of both of which are incorporated herein by reference.

FIELD OF THE INVENTION

The present invention relates to wire bonding of semiconductor devices, and more particularly, to controlled motions during the wire bonding process.

BACKGROUND OF THE INVENTION

In the processing and packaging of semiconductor devices, wire bonding continues to be the primary method of providing electrical interconnection between two locations within a package (e.g., between a die pad of a semiconductor die and a lead of a leadframe). More specifically, using a wire bonder (also known as a wire bonding machine) wire loops are formed between respective locations to be electrically interconnected.

An exemplary conventional wire bonding sequence includes: (1) forming a free air ball on an end of a wire extending from a bonding tool; (2) forming a first bond on a die pad of a semiconductor die using the free air ball; (3) extending a length of wire in a desired shape between the die pad and a lead of a leadframe; (4) stitch bonding the wire to the lead of the leadframe; and (5) severing the wire.

When extending a length of wire between a first bonding location (e.g., a die pad) and a second bonding location (e.g., a lead of a leadframe), a series of motions of a bonding tool which carries the wire are performed, where the motions are intended to provide a wire loop having a desired shape, length, etc. Included in the series of motions of the bonding tool are typically certain "arc" motions. Maintaining a proper arc between two points during loop formation is desirable, and if the arc is not properly maintained a number of problems can result including wire leaning, wire buckling, and uncontrollable location of a bend in the wire. Thus, maintaining a proper arc between two points during loop formation is desirable.

Conventional arc motions are provided to a wire bonding machine in the form of data from predefined look up tables or the like. Such predefined data may also take the form of a few predefined (i.e., fixed) time based position functions. Regardless of the actual form of the conventional methods of providing an arc motion (e.g., a look up table, a predefined function, etc.), certain deficiencies may arise. For example, a user who wants to form an arc in a wire loop selects one of the predefined look up tables that may be the closest approximation to the desired arc motion. Unfortunately, even though the closest approximation is selected, a selected predefined look up table may not provide the desired trajectory for many arc motions or the selected predefined look up table may not provide enough control over the trajectory. Thus, one or more of the aforementioned problems (e.g., wire leaning, wire buckling, uncontrollable location of a bend in the wire, amongst others) may result.

Thus, it would be desirable to provide improved methods of determining the trajectory of arc motions of a wire used in the formation of a wire loop, and related wire bonding methods.

SUMMARY OF THE INVENTION

According to an exemplary embodiment of the present invention, a method of determining a trajectory of an arc motion of a wire used in the formation of a wire loop is provided. The arc motion is between a first point and a second point of the trajectory. The method includes: (1) defining a pivot point with respect to the first point and the second point; (2) determining a plurality of data points for generating the trajectory, each of the data points including a radius value and an angle value as a function of time, each of the angle values being between (a) a first angle defined by the pivot point and the first point, and (b) a second angle defined by the pivot point and the second point; and (3) converting the plurality of data points into trajectory data that may be used by a wire bonding machine.

According to an exemplary embodiment of the present invention, a method of forming a wire loop to provide interconnection between a first bonding location and a second bonding location of a semiconductor device using a wire bonding machine is provided. The method includes the steps of: (1) forming a first bond at the first bonding location with a bonding tool such that a wire engaged with the bonding tool is continuous with the first bond; (2) extending a length of wire from the first bonding location toward the second bonding location; and (3) forming a second bond at the second bonding location such that the wire is continuous from the first bond to the second bond. Step (2) includes moving at least a portion of the length of wire in an arc motion. Step (2) further includes determining a trajectory of the arc motion, the arc motion being between a first point and a second point of the trajectory. The step of determining the trajectory includes: (a) defining a pivot point with respect to the first point and the second point; (b) determining a plurality of data points for generating the trajectory, each of the data points including a radius value and an angle value as a function of time, each of the angle values being between (a) a first angle defined by the pivot point and the first point, and (b) a second angle defined by the pivot point and the second point; and (c) converting the plurality of data points into trajectory data that may be used by a wire bonding machine.

The methods of the present invention may also be embodied as an apparatus (e.g., as part of the intelligence of a wire bonding machine), or as computer program instructions on a computer readable carrier (e.g., a computer readable carrier used in connection with a wire bonding machine).

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

According to an exemplary embodiment of the present invention, a method of providing arc motion trajectories is provided which involves computation (e.g., real time computation) of the trajectories, for example, using: (1) the start XYZ location of the arc; (2) the end XYZ location of the arc; (3) a user defined pivot point; and (4) a radius function of the arc. A resulting trajectory can control the distance from the user defined pivot point along the trajectory, that is, can control the radius of the arc. In certain exemplary embodiments of the present invention, the radius may be a constant, the radius may be controlled as a function of an angle Ø, amongst others.

The trajectory data may be generated real time for each wire loop on a wire bonding machine, for example, after the first bond and second bond locations are found (e.g., using the vision system of the wire bonding machine, using operator alignment, etc.). This may be done because the actual first and second bond positions for each wire loop will affect the trajectory of the wire loop, and as such, the trajectory of each arc motion.

For example, if the starting location (e.g., the start XYZ location) and the end location (e.g., the end XYZ location) are an equal distance to a selected pivot point, the trajectory may follow an arc where any point along the trajectory will have substantially the same distance to the pivot point according to the present invention. In another example, if the starting XYZ location and the end XYZ location are not an equal distance to the pivot point, the change of radius along the trajectory can be provided according to the present invention.

By providing a desired looping trajectory between two points in real time based on user defined data [e.g., the pivot point, the first (e.g., start) point of the arc motion, the second (i.e., end) point of the arc motion, etc.], improved control of loop motions is provided, which in turn generates a more desirable loop shape and improved looping performance. Further benefits may include improved wire sway, improved loop height consistency, and improved wire lay down control.

Figure 1:
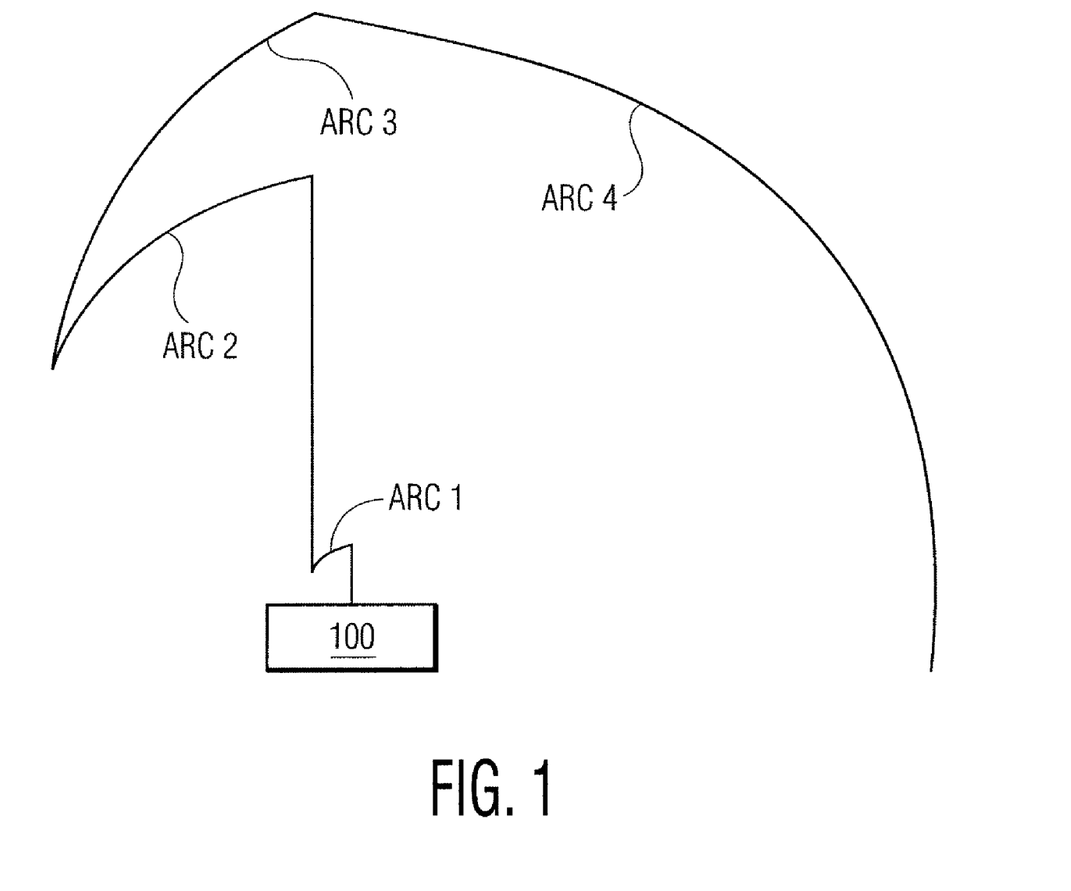
FIG. 1 is a diagram of a wire loop profile illustrating a plurality of exemplary arcs for which trajectories may be determined in accordance with an exemplary embodiment of the present invention.
Figure 2A:
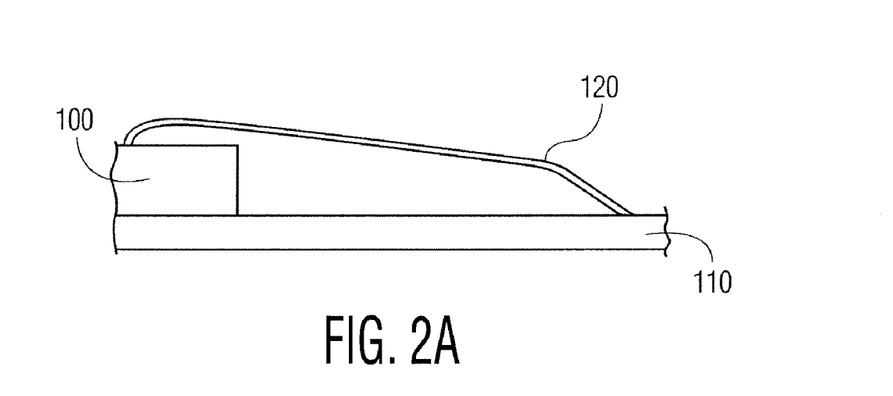
FIG. 2A is a side view of a wire loop formed using a loop profile similar to that illustrated in FIG. 1.
Figure 2B:
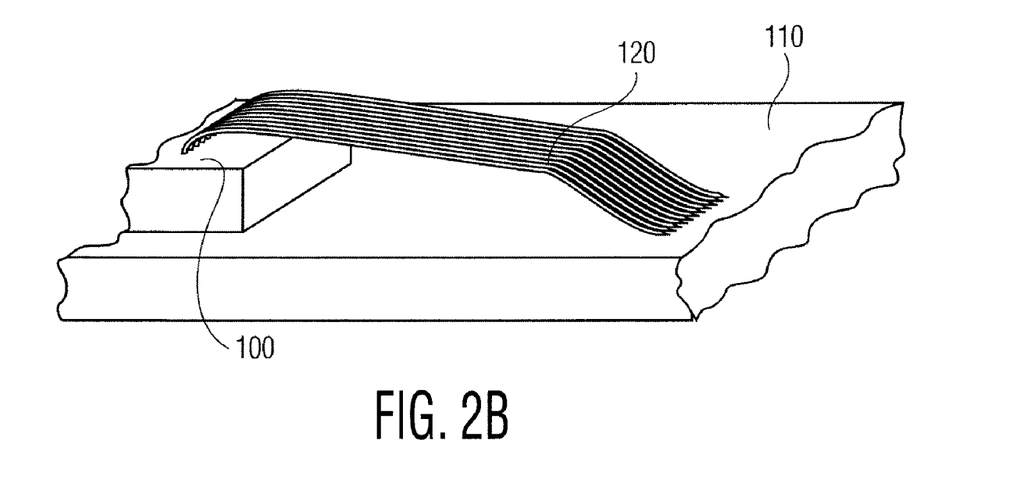
FIG. 2B is a perspective view of a plurality of wire loops formed using a loop profile similar to that illustrated in FIG. 1.

FIG. 1 is an exemplary loop profile diagram including Arc 1 (i.e., an arc motion shortly after $1^{st}$ bond), Arc 2, Arc 3, and Arc 4 (i.e., the arc motion from the top of loop to second bond). Of course, the arc motions illustrated in FIG. 1 are exemplary in nature and different and varying arc motions are contemplated. FIGS. 2A-2B are side and perspective view illustrations of wire loops formed using a loop profile similar to that illustrated in FIG. 1. More specifically, FIGS. 2A-2B illustrate wire loops 120 providing electrical interconnection between a first bonding location (e.g., a die pad of semiconductor die 100) and a second bonding location (e.g., a lead of leadframe 110). Of course, the first and second bonding locations are not limited to any particular location (e.g., the first bonding location may be a lead of a leadframe, the second bonding location may be a die pad, each of the first and second bonding locations may be die pads in die to die bonding, etc.).

Figure 3A:
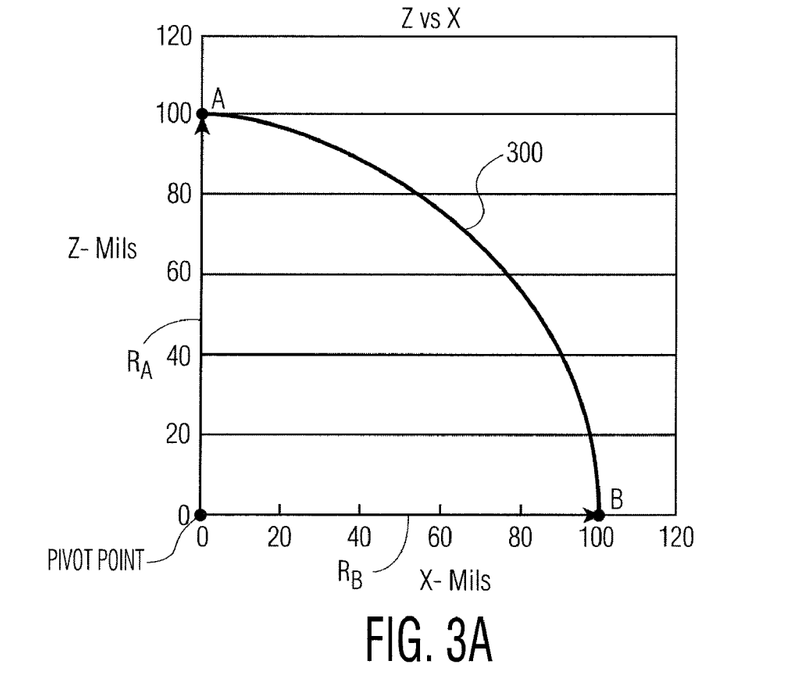
FIG. 3A is a diagram of an arc motion of a loop profile of a wire loop in accordance with an exemplary embodiment of the present invention.

FIG. 3A is a diagram of an arc motion of a loop profile of a wire loop in accordance with an exemplary embodiment of the present invention. In contrast to FIG. 1 (which illustrates a complete loop profile for an exemplary wire loop including four distinct arc motions), FIG. 3A illustrates a single arc 300 provided away from the remainder of a loop profile. Thus, arc 300 may be an arc motion anywhere in a given wire loop between point A and point B. As shown in FIG. 3A, the illustrated arc is shown in two dimensions only (along the X-Z axis), and the radius from the origin is constant along the arc. More specifically, radius $R_A$ extends from the pivot point (in this case, the origin) along the Z-axis 100 mils to point A. Likewise, radius $R_B$ extends from the pivot point along the X-axis 100 mils to point B. In this example, the radius of arc 300 is equal along all points on arc 300 (i.e., the radius is a substantially constant 100 mils along arc 300). Such an arc, while relatively simple, is an example of an arc whose trajectory can be calculated according to the present invention.

Figure 3B:
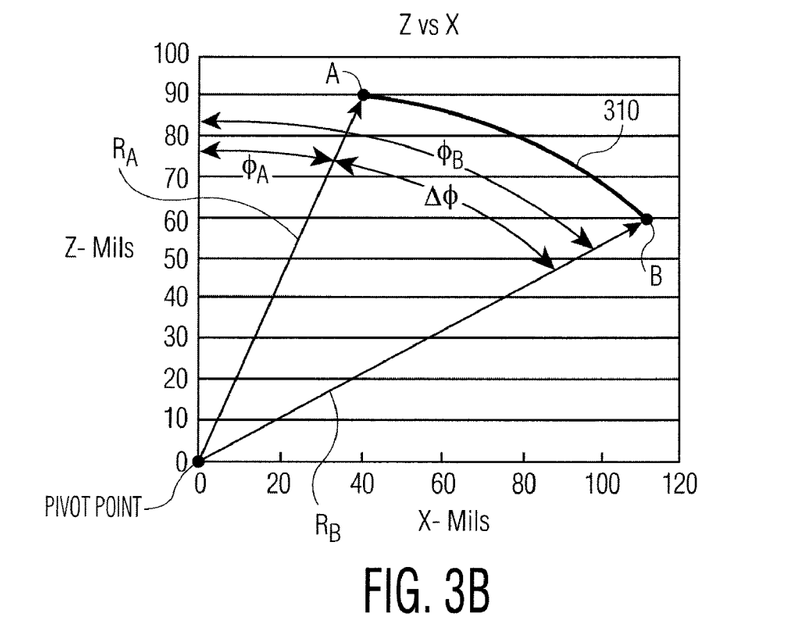
FIG. 3B is a diagram of another arc motion of a loop profile of a wire loop in accordance with another exemplary embodiment of the present invention.

FIG. 3B is a diagram of another arc motion 310 of a loop profile of a wire loop in accordance with another exemplary embodiment of the present invention. In this example, arc motion 310 is between the top of the wire loop (also known as "TOL") and second bond. As shown in FIG. 3B, the illustrated arc is shown in two dimensions only (along the X-Z axis); however, in contrast to the arc illustrated in FIG. 3A, the radius along the arc in FIG. 3B is not constant. That is, in the illustrated example, $R_A$ (i.e., the radius length between the pivot point and first point A) is not equal to $R_B$ (i.e., the radius length between the pivot point and second point B).

More specifically, FIG. 3B illustrates an exemplary desired trajectory for arc motion 310 between point A and B, where the desired arc trajectory is determined using: (1) the radius to each of point A and B from the pivot point (in this example the pivot point is the origin), and (2) the angles $Ø_A$ and $Ø_B$. In this example, the angles are calculated from the Z-axis (i.e., the Z-axis is an example of a reference line used to calculate the angles). Thus, $Ø_A$ is the angle between the Z-axis and $R_A$. Further, $Ø_B$ is the angle between the Z-axis and $R_B$. Finally, $ΔØ$ is the change in angle between $Ø_A$ and $Ø_B$.

Figure 5A:
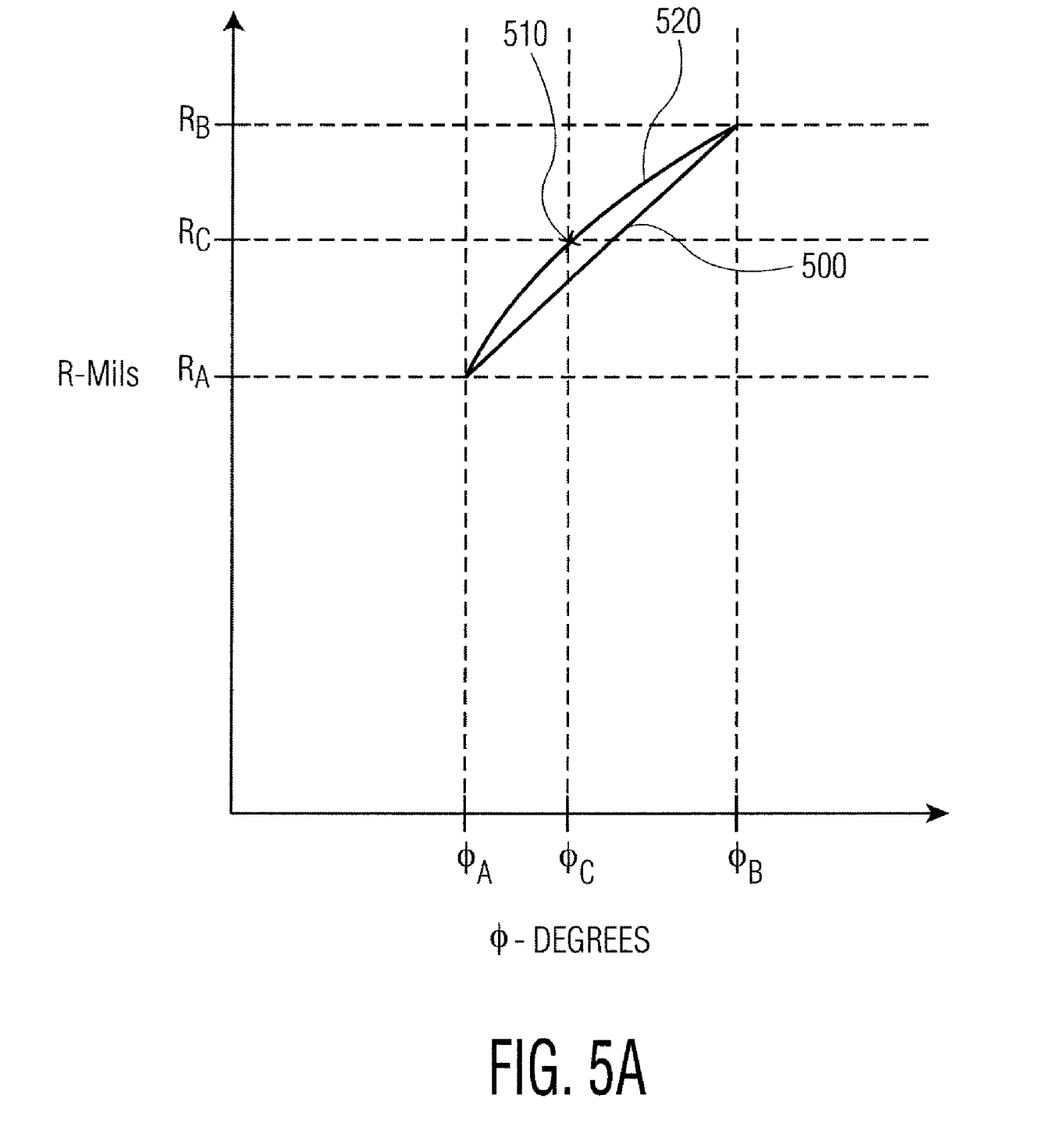
FIG. 5A is a graphical illustration of the change in angle versus the change in radius for certain exemplary embodiments of the present invention.

With reference to the example shown in FIG. 3B, in order to determine the actual trajectory of arc motion 310, a time based function may be applied to certain known information (e.g., $R_A$, $R_B$, $ΔR$, $Ø_A$, $Ø_B$, $ΔØ$). For example, the radius as a function of time [i.e., R(t)] and the angle as a function of time [i.e., Ø(t)] may be determined using expressions such as those provided below:

$$R(t)=(R_A)+(\Delta R*P(t)) \quad \text{Equation 1}$$

$$\emptyset(t)=(\emptyset_A)+(\Delta\emptyset*Q(t)) \quad \text{Equation 2,}$$

where R(t) represents the change in the radius (i.e., the change in radius between $R_A$ and $R_B$) as a function of time; ΔR is the change in radius between $R_A$ and $R_B$; P(t), Q(t) are time based functions used to determine the manner in which the change in radius and angle is to be effected; Ø(t) represents the change in the angle (i.e., the change in angle between $\emptyset_A$ and $\emptyset_B$) as a function of time; and ΔØ is the change in radius between $\emptyset_A$ and ØB. Of course, the functions P(t), Q(t) are to be selected as desired for the given arc motion and for the specific application. In fact, time based functions used in conventional arc motion trajectories may be used for P(t), Q(t) if desired. In one example, P(t) can be the same as Q(t) so that a linear relationship exists between R(t) and Ø(t) (e.g., curve 500 in FIG. 5A).

An exemplary method of determining a desired arc motion (i.e., the desired trajectory of the bend in the wire) is now described with reference to the exemplary arc/trajectory 310 shown in FIG. 3B. The method is described in terms of exemplary steps; however, it is understood that these steps are exemplary in nature, and certain steps may be omitted, added, or changed within the scope of the present invention. Further, the order of certain of the steps may be changed within the scope of the present invention.

Step 1: A pivot point is selected. An exemplary pivot point may be the XYZ location of the bonding tool tip at the first bond. Another exemplary pivot point may be the XYZ location of the bonding tool tip after the short bend formed after first bond (e.g., Arc 1 in FIG. 1). Another exemplary pivot point may be the XYZ location of the bonding tool tip at the end of the heat affected zone of the wire. Any of a number of other pivot points may be selected. For example, the pivot point may be selected based on factors such as the wire length, bending location along the wire, the die height, the properties of the wire, etc. In the exemplary trajectories illustrated in FIGS. 3A-3B, the pivot point is the origin (0,0) in a two-dimensional plane (X-Z). Of course, it is understood that a desired trajectory may be calculated in three dimensional space (XYZ) and in such an case, a three dimensional origin or other pivot point (X, Y, Z) may be selected.

Step 2: The radius and associated angles are determined in connection with the selected pivot point. For example, in FIG. 3B, this data includes ($R_A$, $\emptyset_A$) and ($R_B$ and $\emptyset_B$). Again, this example is provided in two dimensions; however a three dimensional embodiment is also contemplated (e.g., with a third dimension being a y-axis into the page on FIG. 3B).

Step 3: Determine the radius and the angle as a function of time. More specifically, at each of a plurality of time increments, a value for the angle (e.g., a value of the angle Ø between $\emptyset_A$ and $\emptyset_B$) and a value for the radius (e.g., a value of the radius R between $R_A$ and $R_B$) is determined. For example, the values for the angle and the radius may be determined by applying a selected time based function [e.g., P(t) and Q(t)] as in the exemplary Equations 1 and 2 provided above. Again, this example is provided in two dimensions; however a three dimensional embodiment is also contemplated.

Step 4: Convert time based data from Step 3 [e.g., R(t) and Ø(t)] to data that may be used in the trajectory of the wire bonder. More specifically, in the example of FIG. 3B, this may be the x(t) and z(t); however, in a three dimensional example, this may be x(t), y(t), and z(t). Thus, having this data, the desired trajectory is determined.

While the example described above (i.e., Steps 1-4) in connection with FIG. 3B is a specific implementation of the present invention, the present invention is not limited to this implementation. For example, the determination of the trajectory of the arc motion is not limited to any specific methodology, and it is clear that the method described above with respect to FIG. 3B (including Equations 1 and 2) is exemplary and illustrative in nature. Further, the desired trajectory versus time may be determined/calculated using any of a number of systems including Cartesian coordinates, polar coordinates, spherical coordinates, a combination of these coordinate systems, amongst others.

Figure 4:
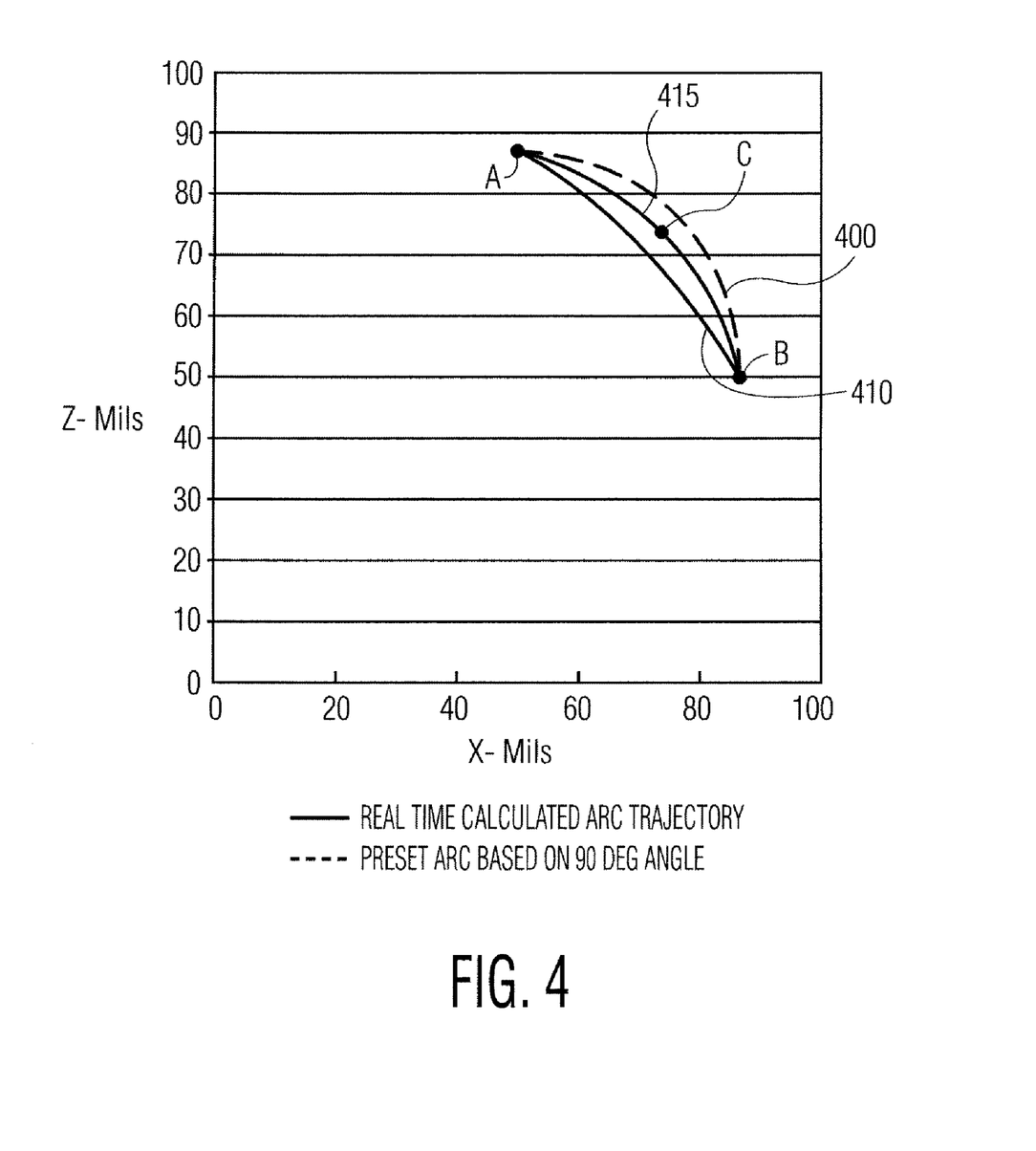
FIG. 4 is a diagram illustrating an arc motion of a wire loop formed in accordance with an exemplary embodiment of the present invention provided in comparison to an arc motion of a wire loop formed using conventional techniques.

FIG. 4 is a diagram illustrating a trajectory determined in accordance with the present invention (arc 410 which is shown as a solid line) along with an exemplary trajectory (arc 400 shown as a dashed line) that was selected from a conventional look-up table. As is clear in FIG. 4, the conventional trajectory (the dashed line 400) does not follow the desired arc motion (the solid line 410). Using the conventional approach may cause problems such as wire buckling and wire compression during the arc motion. Such a wire compression may cause the wire neck region to buckle and lean. In contrast, the solid line (the arc 410 trajectory according to the examplary embodiment of the present invention) tends to keeps the wire straight and buckle free. The desired result is less leaning, less wire buckle, and less wire lay down at the 2nd bond.

Also shown in FIG. 4 is arc 415 including data point C. In certain exemplary embodiments of the present invention, it may be desirable to select a third point of the arc (in addition to the first point A and the second point B) regardless of the time based function to be applied to determine the trajectory of the arc. In FIG. 4, point C represents a third point selected to be included in the trajecory of the arc. Because of the inclusion of point C in the trajecory, the actual trajectory determined according to this exemplary embodiment of the present invention corresponds to arc 415 (as opposed to arc 410 previously described).

As indicated above, in certain exemplary embodiments of the present invention, the radius may be controlled as a function of an angle Ø. This may be embodied in a number of ways, certain examples of which are described herein with respect to FIGS. 5A-5C.

FIG. 5A is a graphical illustration of the change in angle (ΔØ, that is, the change from $\emptyset_A$ to $\emptyset_B$) versus the change in radius (ΔR, that is, the change from $R_A$ to $R_B$) for certain exemplary embodiments of the present invention. In exemplary embodiments of the present invention where a certain relationship is applied to both the change in radius and angle [e.g., when the time based functions P(t) and Q(t) in Equations 1 and 2 are the same], then the relationship of the change in angle versus the change in radius will be linear, as in line segment 500 shown in FIG. 5A. In such an example, the radius is not controlled as a function of an angle Ø because the relationship is linear. However, such a linear relationship is not necessary. In certain applications, it may be desirable to have the trajectory pass through a certain point (e.g., a third point such as point C in FIG. 4) even though that point would not be part of the normal calculated trajectory when applying the given time based function. Thus, when such a third point is chosen to be included in the trajectory (or when multiple additional points are chosen to be included in the trajectory) the relationship between the change in radius and the change in angle may become non-linear. For example, in FIG. 5A, point 510 acts as an indication of the changed relationship when a third point (e.g., point C in FIG. 4) is selected to be included in the trajectory. In fact, curve 520 (which passes through point 510) is the new relationship between the change in radius and the change in angle due to the inclusion of the third point in the trajectory. As shown in FIG. 5A, point 510 corresponds to radius value $R_C$ and angle value $\varnothing_C$ along curve 520. Because the relationship between the change in radius is non-linear for curve 520, it can be said that the radius is controlled as a function of an angle $\varnothing$ (or vice versa).

Figure 5B:
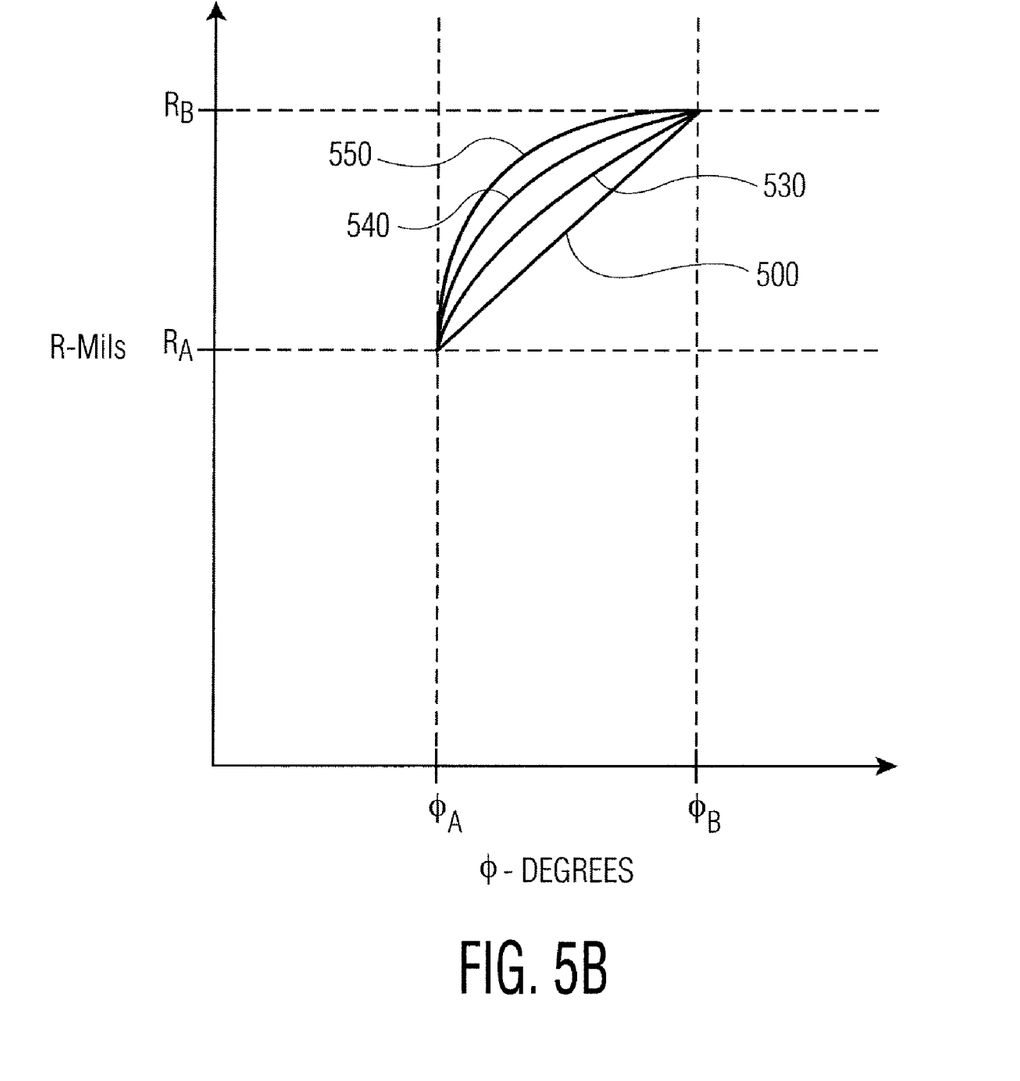
FIG. 5B is another graphical illustration of the change in angle versus the change in radius for certain exemplary embodiments of the present invention.
Figure 5C:
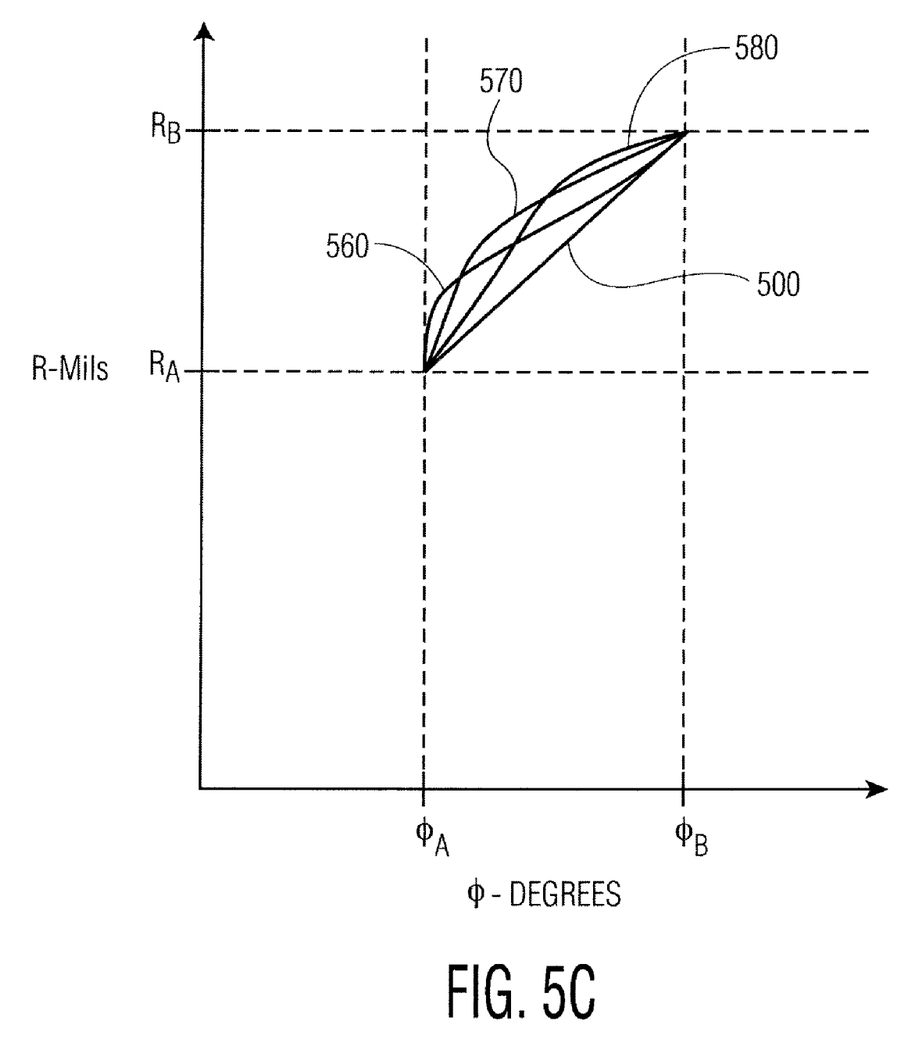
FIG. 5C is yet another graphical illustration of the change in angle versus the change in radius for certain exemplary embodiments of the present invention.

However, there are various ways that the radius may be controlled as a function of an angle $\varnothing$ other than selecting a third point (or multiple additional points) to be included in the trajectory. FIGS. 5B-5C illustrate certain additional exemplary embodiments for controlling the radius as a function of an angle $\varnothing$.

As described above with respect to FIG. 5A, FIG. 5B again shows line segment 500 illustrating the exemplary linear relationship between the change in angle versus the change in radius. Also shown are a number of other curves 530, 540, and 550. The additional curves 530, 540, and 550 represent various scaling/curvature factors being applied to the relationship of the change in angle versus the change in radius, such that the relationship between the change in angle and the change in radius is no longer linear.

FIG. 5C again shows line segment 500 illustrating the exemplary linear relationship between the change in angle versus the change in radius. Also shown are a number of other curves 560, 570, and 580. The additional curves 560, 570, and 580 represent various skew factors being applied to the relationship of the change in angle versus the change in radius, such that the relationship between the change in angle and the change in radius is no longer linear.

Figure 6:
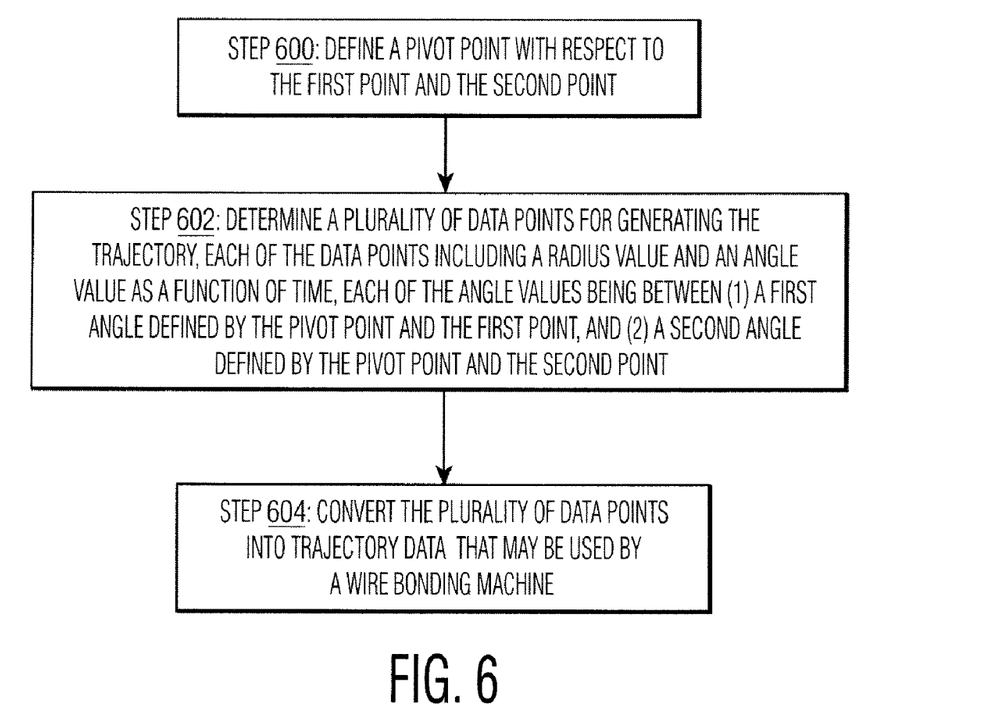
FIG. 6 is a flow diagram illustrating a method of determining a trajectory of an arc motion of a wire used in the formation of a wire loop in accordance with an exemplary embodiment of the present invention.

FIG. 6 is a flow diagram illustrating a method of determining a trajectory of an arc motion of a wire used in the formation of a wire loop in accordance with an exemplary embodiment of the present invention. As is understood by those skilled in the art, certain steps included in the flow diagram may be omitted; certain additional steps may be added; and the order of the steps may be altered from the order illustrated. At step 600, a pivot point is defined with respect to the first point and the second point. For example, in FIG. 3B the pivot point is defined to be the origin. At step 602, a plurality of data points are determined for generating the trajectory. For example, in FIG. 3B the plurality of data points refers to a plurality of points along arc 310. Each of the data points includes a radius value and an angle value at a given time, such that each radius value and angle value is provided by a time based function [e.g., R(t) and $\varnothing$(t)]. Each of the angle values [e.g., $\varnothing$(t)] is between (a) a first angle defined by the pivot point and the first point (e.g., $\varnothing_A$ which is defined by the pivot point and point A), and (b) a second angle defined by the pivot point and the second point (e.g., $\varnothing_B$ which is defined by the pivot point and point B). At step 604, the plurality of data points are converted into trajectory data that may be used by a wire bonding machine. For example, the data points may be in a first form (e.g., polar coordinates such as radius and angle values as a function of time); however, a wire bonding machine may use trajectory data in another different form [e.g., Cartesian coordinates such as x(t), y(t) and z(t)].

Of course, different or additional steps may be provided. For example, the method shown in FIG. 6 could include a step of defining a third point "C" between the first point and the second point (or a third point and a fourth point, or any of a number of additional points, etc.) through which the trajectory shall pass, where the step of defining a third point occurs prior to Step 602. In such a case, additional parameters may be defined. Such parameters may include, for example, $R_C$ and $\varnothing_C$. Of course, using a third point would result in a change in the application of the exemplary time based functions described herein [e.g., time based functions such as P(t) and Q(t) described in connection with Equations 1 and 2 above].

As described above, exemplary embodiments of the present invention may be methods of forming wire loops to provide interconnection between a first bonding location and a second bonding location of a semiconductor device using a wire bonding machine. For example, such a method includes the steps of: (1) forming a first bond at the first bonding location with a bonding tool such that a wire engaged with the bonding tool is continuous with the first bond (e.g., an exemplary first bond is shown in at the interconnection of wire loop 120 and semiconductor die 100 shown in FIGS. 2-3); (2) extending a length of wire from the first bonding location toward the second bonding location; and (3) forming a second bond at the second bonding location such that the wire is continuous from the first bond to the second bond (e.g., an exemplary second bond is shown in at the interconnection of wire loop 120 and leadframe 110 shown in FIGS. 2-3). Step (2) includes moving at least a portion of the length of wire in an arc motion, where the trajectory of the arc motion may be determined in accordance with the teachings herein (e.g., in accordance with the method shown in FIG. 6).

Figure 7:
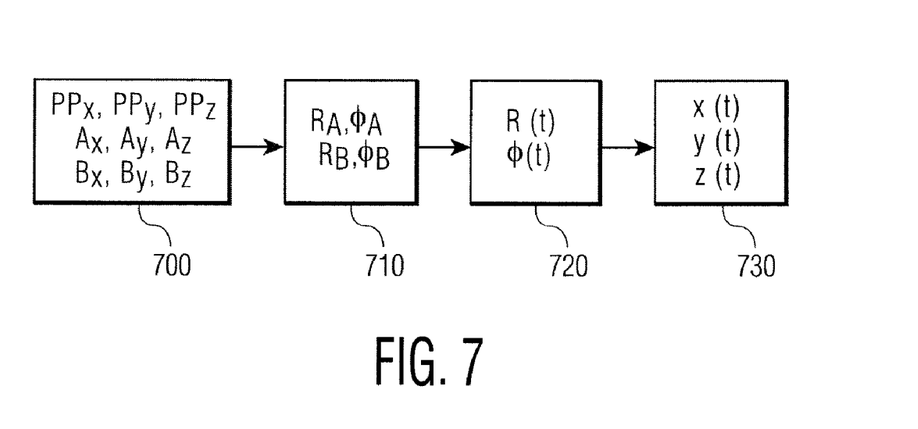
FIG. 7 is a block diagram of an exemplary data transformation used in the determination of a trajectory of an arc motion of a wire used in the formation of a wire loop in accordance with an exemplary embodiment of the present invention.

FIG. 7 is a block diagram of an exemplary data transformation used in the determination of a trajectory of an arc motion of a wire used in the formation of a wire loop in accordance with an exemplary embodiment of the present invention. Of course, other data transformations are contemplated within the scope of the invention. Referring again to FIG. 7, at block 700 the data illustrated includes the position data for the selected pivot point (i.e., $PP_x$, $PP_y$, and $PP_z$), position data for the first point (i.e., $A_x$, $A_y$, and $A_z$), and position data for the second point (i.e., $B_x$, $B_y$, and $B_z$). In the example shown in FIG. 3B, this data at block 700 would relate to the position data of each of the pivot point, point A (i.e., the first point), and point B (i.e., the second point). At block 710 a data transformation has occurred in that the position data (e.g., the position data of the pivot point, the first point, and the second point) has been used to define the first radius between the pivot point and the first point (i.e., in FIG. 3B, $R_A$), the first angle which is between a reference line and the first radius (i.e., in FIG. 3B, $\varnothing_A$), the second radius between the pivot point and the second point (i.e., in FIG. 3B, $R_B$), and the second angle which is between the reference line and the second radius (i.e., in FIG. 3B, $\varnothing_B$).

At block 720 another data transformation has occurred. More specifically, a plurality of data points have been determined for generating the trajectory, where each of the data points including a radius value and an angle value as a function of time [e.g., R(t) and $\varnothing$(t)]. For example, these data points may be determined by applying a time based function as illustrated in the exemplary Equations 1 and 2 above. At block 730, the data points (including a radius value and an angle value as a function of time) are converted into trajectory data used by a wire bonding machine. For example, the data points are converted from polar coordinates [e.g., R(t) and $\varnothing$(t)] to Cartesian coordinates [e.g., x(t), y(t), and z(t)].

Of course, if additional data points are predetermined for inclusion in the trajectory (e.g., a third data point "C" as described above), then the data transformations shown in FIG. 7 would change accordingly. For example, block 700 could also include the position data for the additional data point(s) [e.g., $C_x$, $C_y$, and $C_z$). Likewise, block 710 could also include radius and angle information of the additional data point(s) [e.g., $R_C$ and $\varnothing_C$].

While certain exemplary embodiments of the present invention illustrated herein are provided in a two-dimensional form (e.g., Z vs. X in FIGS. 3A, 3B, and 4) it is understood that the present invention contemplates embodiments using three dimensions. For example, the curves 410 and 415 shown in FIG. 4 may be two-dimensional only (i.e., with no change along the y-axis); however, the curves 410 and 415 shown in FIG. 4 may also exhibit a y-axis component (i.e., the curves may extend into and/or out of the page).

The techniques of the present invention may be implemented in a number of alternative mediums. For example, the techniques can be installed on an existing computer system/server as software (a computer system used in connection with, or integrated with, a wire bonding machine). Further, the techniques may operate from a computer readable carrier (e.g., solid state memory, optical disc, magnetic disc, radio frequency carrier medium, audio frequency carrier medium, etc.) that includes computer instructions (e.g., computer program instructions) related to the techniques.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of determining a trajectory of an arc motion of a wire used in the formation of a wire loop, the arc motion being between a first point and a second point of the trajectory, the method comprising the steps of:
   (1) defining a pivot point with respect to the first point and the second point, the first point including a first radius value and a first angle value, the first radius value being between the pivot point and the first point, the first angle value being defined by the pivot point and the first point, the second point including a second radius value and a second angle value, the second radius value being between the pivot point and the second point, the second angle value being defined by the pivot point and the second point;
   (2) determining a plurality of data points for generating the trajectory, each of the data points including a radius value and an angle value determined using at least one time based function, each of the angle values being between (a) the first angle value, and (b) the second angle value; and
   (3) converting the plurality of data points, including the first point and the second point, into trajectory data that may be used by a wire bonding machine.

2. The method of claim 1 wherein step (1) includes defining the pivot point to be equidistant from each of the first point and the second point.

3. The method of claim 2 wherein the radius value of each of the data points determined in step (2) is substantially the same.

4. The method of claim 1 wherein step (1) includes defining the pivot point such that the first point and the second point are different distances from the defined pivot point.

5. The method of claim 1 wherein step (3) includes converting the plurality of data points into Cartesian coordinate trajectory data.

6. The method of claim 5 wherein the Cartesian coordinate trajectory data points includes values along the z-axis of a wire bonding machine and at least one of the x-axis of the wire bonding machine and the y-axis of the wire bonding machine.

7. The method of claim 5 wherein the Cartesian coordinate trajectory data points includes values along the z-axis of a wire bonding machine, the x-axis of the wire bonding machine, and the y-axis of the wire bonding machine.

8. The method of claim 1 further comprising the step of (4) selecting a third point between the first point and the second point in the arc motion, wherein step (4) is accomplished prior to step (2).

9. The method of claim 1 further comprising the step of (4) selecting at least one additional point between the first point and the second point in the arc motion, wherein step (4) is accomplished prior to step (2).

10. The method of claim 1 further comprising a step of (4) determining the first radius value between the pivot point and the first point, determining the second radius value between the pivot point and the second point, wherein step (4) is accomplished prior to the determining of the plurality of data points in step (2), and wherein the first angle value is defined between a reference line and the first radius value, and wherein the second angle value is defined between the reference line and the second radius value.

11. The method of claim 10 wherein step (2) includes using the at least one time based function in conjunction with the first radius value, the second radius value, the first angle value, and the second angle value, in order to determine the plurality of data points for generating the trajectory.

12. The method of claim 1 wherein the arc motion corresponds to an arc motion from a top of loop position to a second bond position.

13. The method of claim 1 wherein the arc motion corresponds to an arc motion shortly after formation of a first bond of the wire loop.

14. The method of claim 1 wherein step (1) includes defining the pivot point to be one of (1) a location of a bonding tool tip at a first bond position, (2) a location of the bonding tool tip after forming a short bend after formation of a first bond, and (3) a location of the bonding tool tip at the end of a heat affected zone of the wire.

15. A non-transitory computer readable carrier including computer program instructions which cause a computer to implement a method of determining a trajectory of an arc motion of a wire used in the formation of a wire loop, the arc motion being between a first point and a second point of the trajectory, the method comprising the steps of:
   (1) defining a pivot point with respect to the first point and the second point, the first point including a first radius value and a first angle value, the first radius value being between the pivot point and the first point, the first angle value being defined by the pivot point and the first point, the second point including a second radius value and a second angle value, the second radius value being between the pivot point and the second point, the second angle value being defined by the pivot point and the second point;
   (2) determining a plurality of data points for generating the trajectory, each of the data points including a radius value and an angle value determined using at least one time based function, each of the angle values being between (a) the first angle value, and (b) the second angle value; and
   (3) converting the plurality of data points, including the first point and the second point, into trajectory data that may be used by a wire bonding machine.

16. A method of forming a wire loop to provide interconnection between a first bonding location and a second bonding location of a semiconductor device using a wire bonding machine, the method comprising the steps of:
   (1) forming a first bond at the first bonding location with a bonding tool such that a wire engaged with the bonding tool is continuous with the first bond;

(2) extending a length of wire from the first bonding location toward the second bonding location, step (2) including moving at least a portion of the length of wire in an arc motion, step (2) further including determining a trajectory of the arc motion, the arc motion being between a first point and a second point of the trajectory, the step of determining the trajectory including:
  (a) defining a pivot point with respect to the first point and the second point, the first point including a first radius value and a first angle value, the first radius value being between the pivot point and the first point, the first angle value being defined by the pivot point and the first point, the second point including a second radius value and a second angle value, the second radius value being between the pivot point and the second point, the second angle value being defined by the pivot point and the second point,
  (b) determining a plurality of data points for generating the trajectory, each of the data points including a radius value and an angle value determined using at least one time based function, each of the angle values being between (a) the first angle value, and (b) the second angle value, and
  (c) converting the plurality of data points, including the first point and the second point, into trajectory data that may be used by a wire bonding machine; and
(3) forming a second bond at the second bonding location such that the wire is continuous from the first bond to the second bond.

17. The method of claim 16 wherein step (c) includes converting the plurality of data points into Cartesian coordinate trajectory data.

18. The method of claim 16 wherein step (2) further comprises the step of (d) selecting a third point between the first point and the second point in the arc motion, wherein step (d) is accomplished prior to step (b).

19. The method of claim 16 wherein step (2) further comprises the step of (d) selecting at least one additional point between the first point and the second point in the arc motion, wherein step (d) is accomplished prior to step (b).

20. The method of claim 16 wherein the step of determining the trajectory in step (2) further comprises a step of (d) determining the first radius value between the pivot point and the first point, determining the second radius value between the pivot point and the second point, wherein step (d) is accomplished prior to the determining of the plurality of data points in step (b), and wherein the first angle value is defined between a reference line and the first radius value, and wherein the second angle value is defined between the reference line and the second radius value.

21. The method of claim 20 wherein step (b) includes using the least one time based function in conjunction with the first radius value, the second radius value, the first angle value, and the second angle value, in order to determine the plurality of data points for generating the trajectory.

22. The method of claim 16 wherein the arc motion corresponds to an arc motion from a top of loop position to a second bond position.

23. The method of claim 16 wherein the arc motion corresponds to an arc motion shortly after formation of a first bond of the wire loop.

24. The method of claim 16 wherein step (a) includes defining the pivot point to be one of (1) a location of a bonding tool tip at a first bond position, (2) a location of the bonding tool tip after forming a short bend after formation of a first bond, and (3) a location of the bonding tool tip at the end of a heat affected zone of the wire.

25. A non-transitory computer readable carrier including computer program instructions which cause a computer to implement a method of forming a wire loop to provide interconnection between a first bonding location and a second bonding location of a semiconductor device using a wire bonding machine, the method comprising the steps of:
  (1) forming a first bond at the first bonding location with a bonding tool such that a wire engaged with the bonding tool is continuous with the first bond;
  (2) extending a length of wire from the first bonding location toward the second bonding location, step (2) including moving at least a portion of the length of wire in an arc motion, step (2) further including determining a trajectory of the arc motion, the arc motion being between a first point and a second point of the trajectory, the step of determining the trajectory including:
    (a) defining a pivot point with respect to the first point and the second point, the first point including a first radius value and a first angle value, the first radius value being between the pivot point and the first point, the first angle value being defined by the pivot point and the first point, the second point including a second radius value and a second angle value, the second radius value being between the pivot point and the second point, the second angle value being defined by the pivot point and the second point;
    (b) determining a plurality of data points for generating the trajectory, each of the data points including a radius value and an angle value determined using at least one time based function, each of the angle values being between (a) the first angle value, and (b) the second angle value; and
    (c) converting the plurality of data points, including the first point and the second point, into trajectory data that may be used by a wire bonding machine; and
  (3) forming a second bond at the second bonding location such that the wire is continuous from the first bond to the second bond.

* * * * *